US012571837B2

(12) United States Patent
Zhou et al.

(10) Patent No.: US 12,571,837 B2
(45) Date of Patent: Mar. 10, 2026

(54) SEMICONDUCTOR DEVICE WITH A PROTECTIVE DIODE CONNECTED TO A FUSE

(71) Applicant: INTERNATIONAL BUSINESS MACHINES CORPORATION, Armonk, NY (US)

(72) Inventors: Huimei Zhou, Albany, NY (US); Yuncheng Song, Halfmoon, NY (US); Terence Hook, Jericho Center, VT (US); Miaomiao Wang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 180 days.

(21) Appl. No.: 18/614,617

(22) Filed: Mar. 22, 2024

(65) Prior Publication Data

US 2025/0298073 A1 Sep. 25, 2025

(51) Int. Cl.
G01R 31/28 (2006.01)
H01L 23/525 (2006.01)
H10D 89/60 (2025.01)

(52) U.S. Cl.
CPC ...... G01R 31/2884 (2013.01); H01L 23/5258 (2013.01); H10D 89/611 (2025.01)

(58) Field of Classification Search
CPC ........... G01R 31/2884; H01L 23/5258; H10D 89/611

USPC ................................... 324/762.01, 537, 500
See application file for complete search history.

(56) References Cited

U.S. PATENT DOCUMENTS

| | | | |
|---|---|---|---|
| 7,098,491 B2 | 8/2006 | Hsieh | |
| 7,459,350 B2 | 12/2008 | Hsieh | |
| 7,981,732 B2 | 7/2011 | Badami | |
| 8,541,264 B2 | 9/2013 | Lin | |
| 8,552,569 B2 | 10/2013 | Lee | |
| 8,809,165 B2 | 8/2014 | Mackh | |
| 10,181,713 B2 | 1/2019 | Bousquet | |
| 10,338,133 B2 * | 7/2019 | Chakrabarty | ....... H01L 23/5383 |
| 11,573,261 B2 * | 2/2023 | Lee | ......... H01L 22/34 |
| 11,664,334 B2 | 5/2023 | Djemour | |
| 2002/0033710 A1 | 3/2002 | Kim | |
| 2003/0038338 A1 | 2/2003 | Fournel | |
| 2022/0336375 A1 * | 10/2022 | Kim | ................... H01L 23/5386 |

FOREIGN PATENT DOCUMENTS

EP          4057344 A1       9/2022

* cited by examiner

*Primary Examiner* — Giovanni Astacio-Oquendo
(74) *Attorney, Agent, or Firm* — Scully, Scott, Murphy & Presser, P.C.; L. Jeffrey Kelly

(57) ABSTRACT

A semiconductor device includes a device under test, and a protection circuit electrically connected to the device under test, the protection circuit including: a protective diode, and a laser fuse configured to, upon receiving a laser pulse via an opening, break an electrical path of the protective diode and he device under test.

20 Claims, 9 Drawing Sheets

700A

FORM DEVICE UNDER TEST/PROTECTIVE DIODE
710

FORM THE LASER FUSE
720

ACTIVATE THE PROTECTION CIRCUIT
730

BREAK THE LASER FUSE AND DISCONNECT THE PROTECTIVE DIODE
740

700B →

FORM DEVICE UNDER TEST/PROTECTIVE DIODE/LASER FUSE
760

FORM THE PROTECTION CIRCUIT
770

ACTIVATE THE PROTECTION CIRCUIT
780

BREAK THE LASER FUSE AND DISCONNECT THE PROTECTIVE DIODE
790

1

SEMICONDUCTOR DEVICE WITH A PROTECTIVE DIODE CONNECTED TO A FUSE

BACKGROUND

Technical Field

The present disclosure generally relates to semiconductor devices, and more particularly, to semiconductor devices with protective diodes connected to a fuse structure, and methods of creation thereof.

Description of the Related Art

Constructing a fully packaged integrated circuit product from raw semiconductor material involves sequenced progression through a series of intricate fabrication operations. Various wafer processes leverage plasma technology including reactive ionized gas mixtures. Abundantly generated electrons without discharge pathways can accumulate electrical charge on wafer features that can migrate across the circuits. Resulting currents can compromise transistor properties that constitute memory cells or logic gates. Thus, mitigating mechanisms of plasma induced damage should supplement the etching, doping and film deposition steps enabling chip fabrication.

SUMMARY

According to an embodiment, semiconductor device includes a device under test, and a protection circuit electrically connected to the device under test, the protection circuit including: a protective diode, and a laser fuse configured to, upon receiving a laser pulse via an opening, break an electrical path of the protective diode and the device under test.

In some embodiments, the semiconductor device includes a first wire, and a second wire. The laser fuse is configured to electrically connect the first wire and the second wire.

In some embodiments, the second wire is connected to the device under test.

In some embodiments, the opening is in a frontside of the semiconductor device.

In some embodiments, the opening is in a backside of the semiconductor device.

In some embodiments, the semiconductor device includes a first wire, and a second wire. The protection circuit and the device under test are electrically connected.

In some embodiments, the laser fuse is configured to electrically connect the first wire and the second wire.

In some embodiments, the first wire is electrically connected to the protective diode.

In some embodiments, the second wire is electrically connected to the device under test.

According to an embodiment, a method for fabricating a semiconductor device includes forming a device under test, and forming a protection circuit electrically connected to the device under test. Forming the protection circuit includes forming a protective diode, and forming a laser fuse to, upon receiving a laser pulse via an opening, break an electrical path of the protective diode and the device under test.

In some embodiments, the method includes forming a first wire, forming a second wire, and establishing an electrical connection, by the laser fuse, between the first wire and the second wire. The laser fuse is formed on the frontside of the semiconductor device.

In some embodiments, the method includes electrically connecting the second wire to the device under test.

In some embodiments, the method includes forming the protection circuit, and electrically connecting the first wire to the protective diode.

In some embodiments, the method includes receiving the laser pulse from the opening in a frontside of the semiconductor device.

In some embodiments, the method includes receiving the laser pulse from the opening in a backside of the semiconductor device.

In some embodiments, the method includes forming a first wire, forming a second wire, and electrically connecting the protection circuit and the device under test.

In some embodiments, the method includes electrically connecting the laser fuse to the first wire and the second wire.

In some embodiments, the method includes electrically connecting the first wire to the protective diode.

According to an embodiment, an integrated circuit includes a device, and a protection circuit electrically connected to the device, the protection circuit includes a protective diode, and a laser fuse configured to, upon receiving a laser pulse via an opening, break an electrical path of the protective diode and the device under test.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1:
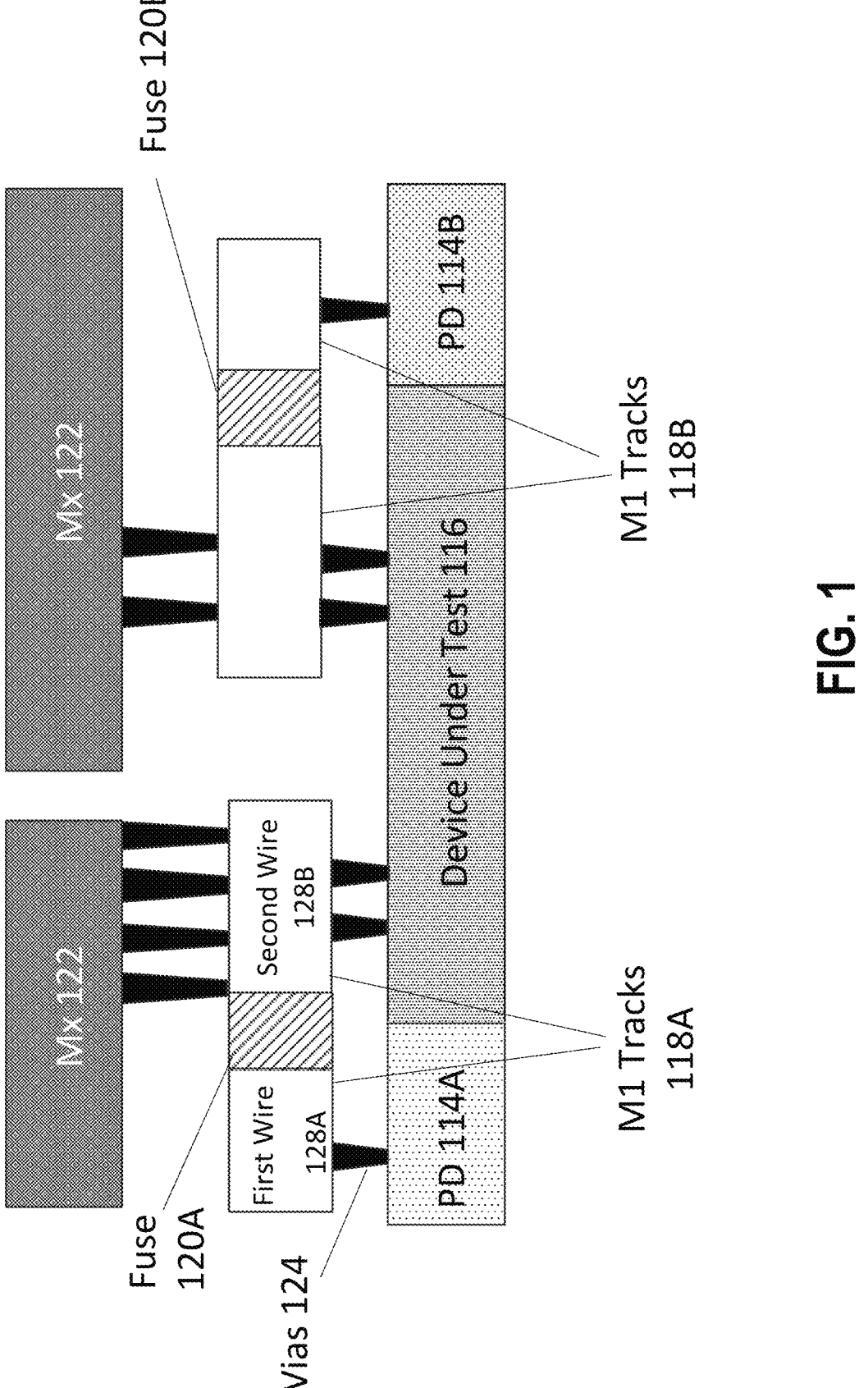
FIG. 1 illustrates a semiconductor device, in accordance with some embodiments.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "over, "bottom," "beneath," "below," "lower," above," "upper," "side," "left," "right," and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of an element.

As used herein, the term "vertical" describes an orientation that is arranged perpendicular to the first surface of an element.

As used herein, the terms "coupled" and/or "electrically coupled" are not meant to mean that the elements must be directly coupled together-intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

As used herein, certain terms are used indicating what may be considered an idealized behavior, such as, for example, "lossless," "superconductor," or "superconductor," which are intended to cover functionality that may not be exactly ideal but is within acceptable margins for a given application. For example, a certain level of loss or tolerance may be acceptable such that the resulting materials and structures may still be referred to by these "idealized" terms.

The concepts herein relate to protective diodes in integrated circuits and the use of fuse connects with the protective diodes. Constructing a fully packaged integrated circuit product from raw semiconductor material involves sequenced progression through a series of intricate fabrication operations. Each step enables transformation closer to the final device functionality. The diverse processes span growing bulk semiconductor crystals to slicing wafers, patterning microscale device structures using etching and lithography, implanting select dopants, metallizing electrical interconnects, bonding external contacts, to finally testing finished circuit behavior. As the expertise and equipment involved for these procedures are distinct, they are divided across dedicated manufacturing facilities before final assemble. Various wafer processes leverage plasma technology including reactive ionized gas mixtures. Plasmas selectively etch submicron features, remove residues, or assist material reactions with the surface. By applying electromagnetic fields, the gases ionize into positive ions and free electrons. Based on process conditions, these plasma constituents either directly sputter away wafer atoms through momentum transfer or indirectly react. Plasma etching afforded by both chemical and physical interactions thereby sculpts modern transistor geometries.

However, abundantly generated electrons without discharge pathways accumulate electrical charge on wafer features that can migrate across the circuits. These migrating charges pose contamination issues for gate insulators and junctions. Resulting currents compromise transistor properties that constitute memory cells or logic gates. Thus, mitigating mechanisms of plasma induced damage should supplement the etching, doping and film deposition steps enabling chip fabrication.

During the manufacturing process flow for integrated circuit products containing dense arrangements of transistors and logic gates, once fabrication is completed, a series of electrical tests are conducted. These tests verify correct functional operation of the circuits and analyze parametric performance to qualify reliability margins. For a standalone transistor device not wired into functional surrounding circuitry, specialized test structures are utilized. Discrete test transistors will have the gate, source, and drain terminals each connected to separate probe pads consisting of metal contact pads exposed on the wafer surface. These probe pads enable direct physical access so that automated test equipment can apply signals and bias voltages, and measure the resulting currents at each transistor terminal independently. This direct physical access facilitates characterization of key transistor operating parameters. However, the probed terminals risk exposure to the various plasma etch and photoresist stripping processes used in integrated circuit fabrication. For example, the energetic plasma ions can penetrate and damage the fragile gate dielectric insulation material, which are to remain defect-free over the product lifetime for reliable switching behavior.

Therefore, to protect the test transistor from accumulated plasma-induced damage either during fabrication steps or the electrical probing itself, protective diodes are intentionally created in parallel across the gate dielectric. These diodes are reverse biased and nonconductive under normal transistor biasing. In the event of gate dielectric defects enabling leakage current flows during testing, the protective diodes turn on to clamp voltages and prevent catastrophic dielectric breakdowns, thereby safeguarding future test repeatability.

However, when performing testing of the transistor, measuring gate leakage may become inaccurate due to the diode leakage. Further, any variations in the pitch of the formations during processing can lead to significant diode leakage using the state-of-the-art process. Moreover, the presence of the protective diode may cause off-state gate leakage problems. Other problems can include the inability to perform stress test using negative stress voltage, due to the presence of the protective diode, and the inability to perform tests using AC signals because of the protective diode.

Typically, electrostatic discharge (ESD) is a sudden flow of electricity between two electrically charged objects caused by contact, an electrical short, or dielectric breakdown. Build-up of static electric charges on personnel, tools, equipment, and materials can occur naturally from friction, induction, etc., which generates strong electric fields. When an object holding charges comes close to a conductive piece connected to ground, the voltage difference may exceed the dielectric withstand strength of the intervening medium causing rapid ESD currents for charge neutralization.

In view of the above considerations and others, disclosed is a semiconductor device with a protective diode connected to a laser fuse. The disclosed semiconductor device with the protective diode connected to the laser fuse can prevent the plasma discharge damage, e.g., ESD, to the device under test by way of utilizing the laser fuse that would be blown after fabrication. Utilizing a laser fuse instead of an electrical fuse, there is no need for a fuse pad and the required electrical components. In other words, instead of using an overvoltage, the laser fuse can be opened by the laser. Further, utilizing the laser fuse involves less wiring overhead, which results in mitigating the shorting potential and the corresponding chip real estate. The fuse can be connected after the fabrication of the semiconductor device or before the testing.

The disclosed semiconductor device can offer protection against ESD during fabrication. The laser fuse would be blown away after fabrication to create an open between the circuit of the protective diode and the device under test. Thus, any parasitic components associated therewith would be removed. In this way, the disclosed semiconductor device can protect the device under test against potential plasma damage during the fabrication.

Accordingly, the teachings herein provide methods and systems for fabricating a semiconductor device. The techniques described herein may be implemented in a number of ways. Example implementations are provided below with reference to the following figures.

Example Semiconductor Device with a Protective Diode Connected to a Fuse Structure Reference is now made to FIG. 1, which is a schematic illustration of a semiconductor device with protective diodes connected to a fuse, in accordance with some embodiments. The semiconductor device can include a wiring region, metallization layer Mx 122, a first protective diode, PD 114A, a second protective diode, PD 114B, a device under test 116, metal wires, M1 tracks 118A and M1 tracks 118B, and a laser fuse 120. The device under test 116 can be a transistor, an integrated circuit, or any other electrical devices.

It should be noted that, the semiconductor device can be used in backside power delivery network (BSPDN). The semiconductor device can include other components such as gates, source/drain regions, shallow trench isolation (STI), dielectric layers, spacers, interconnects and wirings. Each of the protective diodes, e.g., PD 114A and PD 114B, can be integrated parallel across the terminals of the device under test 116 in order to safeguard it from process or measurement induced damage during electrical probing. The PD 114A and PD 114B configurations allow current to flow through them rather than into layers of the device under test 116. The PD 114A and/or PD 114B can turn on during overvoltage breakdown and provide a bypass path. Wiring connection and the laser fuse 120 can be located on the frontside middle of line (MOL), or on the first layer metal, or on the backside first metal layer. Further, the metallization layer Mx 122 can be located on the frontside layer of the semiconductor device, or on the backside layer of the semiconductor device.

The M1 tracks 118 can include a first metal wire 128A and a second metal wire 128B. The first metal wire 128A is electrically connected to the PD 114A. The first metal wire 128a is further connected to the laser fuse 120A and the metallization layer Mx 122 through the vias 124. The second metal wire 128B is electrically connected to the device under test 116. The second metal wire 128B is further connected to the laser fuse 120A and the metallization layer Mx 122 through the vias 124. The laser fuse 120A can connect the first metal wire 128A and the second metal wire 128B.

The vias 124 are vertical electrical connections between two conductors on different metal wiring layers that are separated by intermediate insulating films. The vias 124 provide interlayer connectivity through the vertically integrated stack of patterned metallization and dielectric levels in an integrated circuit. In some embodiments, the vias 124 are formed by etching a hole or opening within a deposited dielectric layer to partially expose the underlying metal surface, then filling that cavity with a conductive material, e.g., tungsten or copper, to complete an electrical feeding path between the two bookending wiring layers to interconnect.

Figure 2:
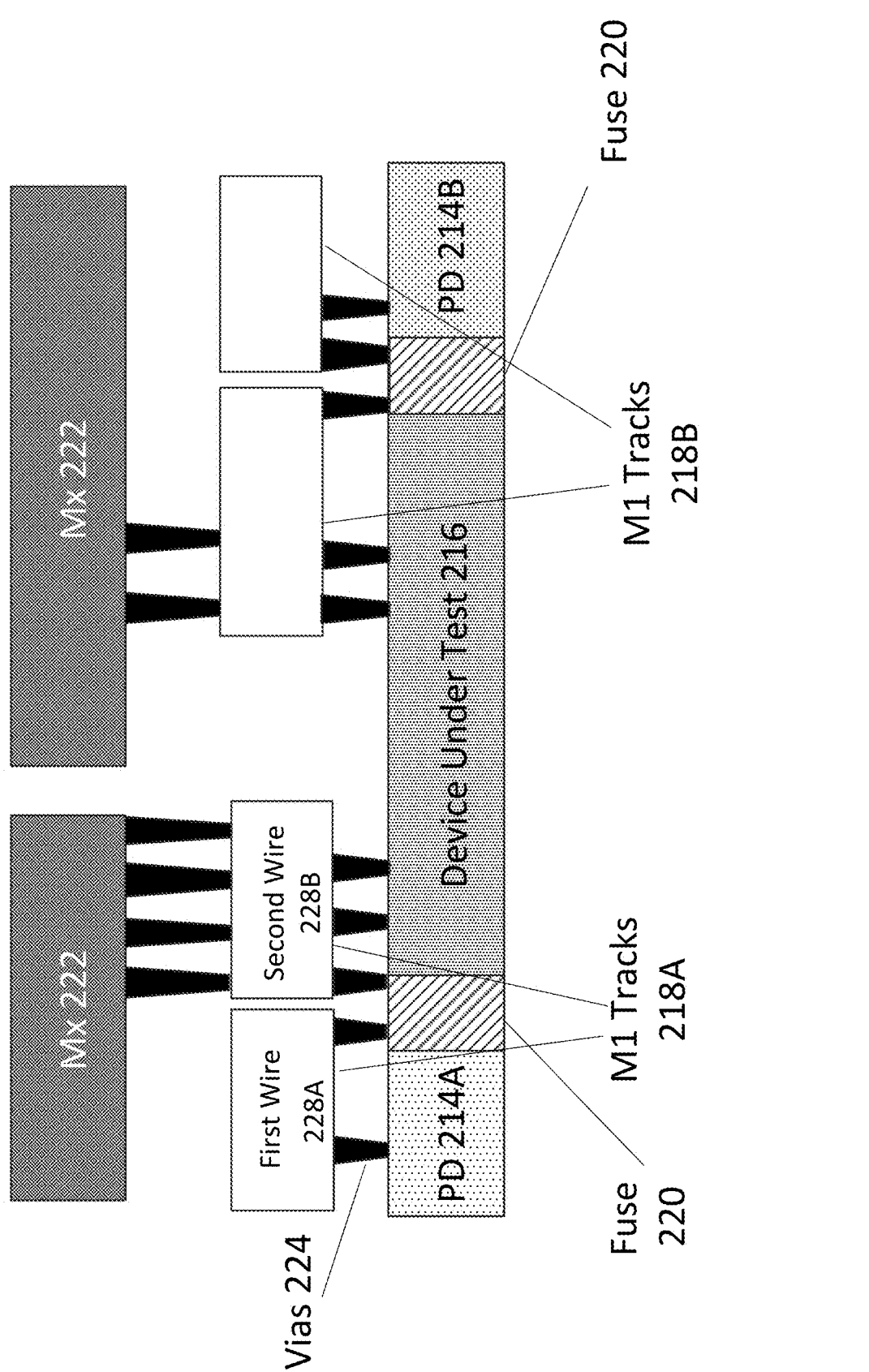
FIG. 2 illustrates a semiconductor device, in accordance with some embodiments.

Reference is now made to FIG. 2, which is a schematic illustration of a semiconductor device with protective diodes connected to a laser fuse, in accordance with some embodiments. The semiconductor device as shown include an area with high density of vias (left part) and an area with a large metal area (right part). The semiconductor device can include a first protective diode, PD 214A, a second protective diode, PD 214B, a device under test 216, a laser fuse 220 and metal wires, e.g., M1 tracks 218A and M1 tracks 218B. The device under test 216 can be a transistor, an integrated circuit, or any other electrical device.

Although not shown, the semiconductor device can include other components such as gates, source/drain regions, shallow trench isolation (STI), dielectric layers, spacers, interconnects and wirings. Each of the protective diodes, e.g., PD 214A and PD 214B, can be integrated parallel across the terminals of the device under test 216 in order to safeguard it from process or measurement induced damage during electrical probing. The PD 214A and PD 214B configurations allow current to flow through them rather than into layers of the device under test 216. The PD 214A and/or PD 214B can turn on during overvoltage breakdown and provide a bypass path.

The M1 tracks 218A can include a first metal wire 228A and a second metal wire 228B. The first metal wire 228A is electrically connected to the PD 214A. The first metal wire 228A is further connected to the laser fuse 220 through the vias 224. The second metal wire 228B is electrically connected to the device under test 216. The second metal wire 228B is further connected to the laser fuse 220. The laser fuse 220 can connect the PD 214A to the device under test 216.

The vias 224 are vertical electrical connections between two conductors on different metal wiring layers that are separated by intermediate insulating films. The vias 224 provide interlayer connectivity through the vertically integrated stack of patterned metallization and dielectric levels in an integrated circuit. In some embodiments, the vias 224 are formed by etching a hole or opening within a deposited dielectric layer to partially expose the underlying metal surface, then filling that cavity with a conductive material, e.g., tungsten or copper, to complete an electrical feeding path between the two bookending wiring layers to interconnect.

Figure 3:
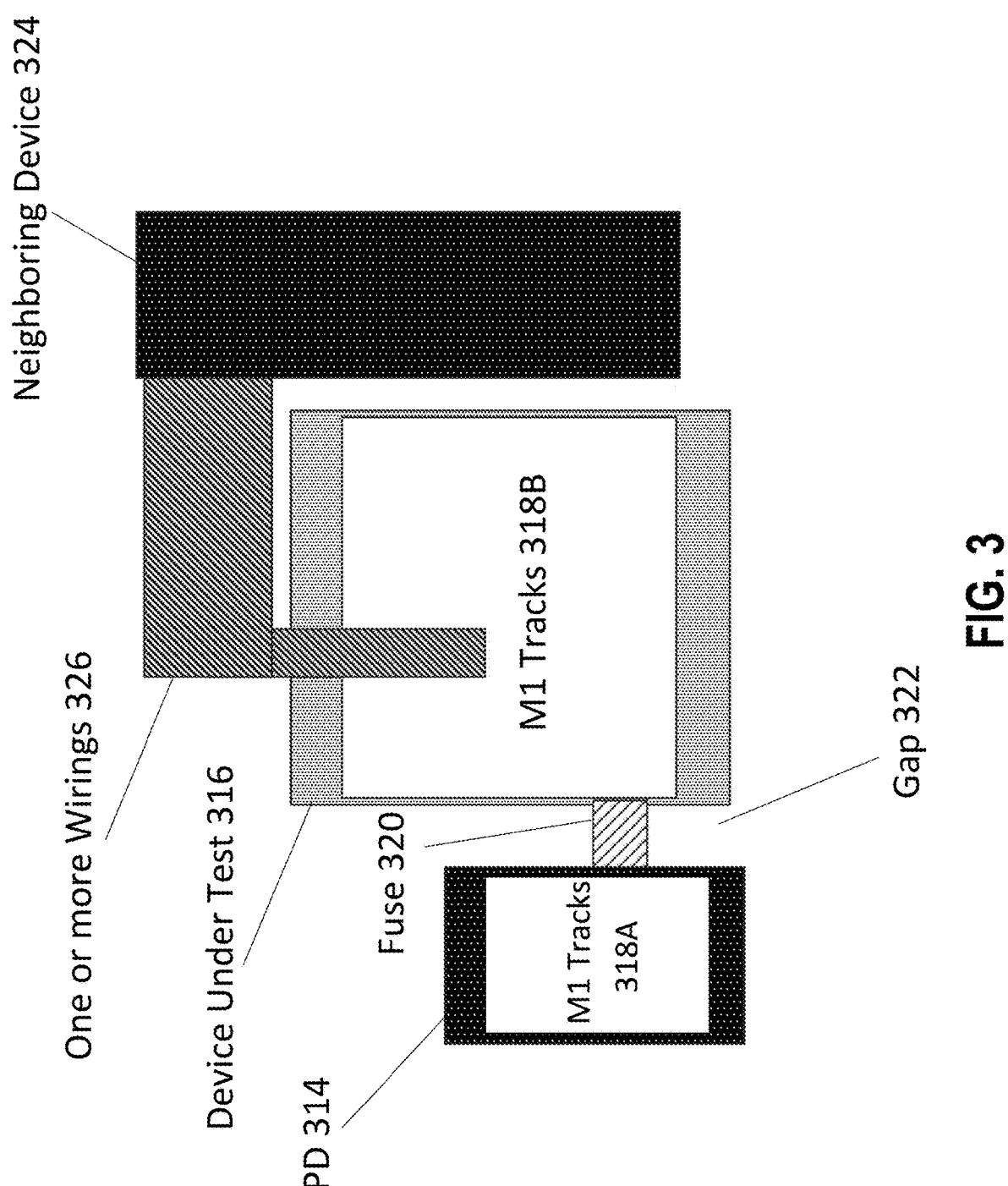
FIG. 3 illustrates a top-down view of an opening within a semiconductor device, in accordance with some embodiments.

FIG. 3 illustrates a top-view of an opening within a semiconductor device, in accordance with some embodiments. It should be noted that, in order to show the underlying layers, the metallization layer Mx is removed. As shown, the semiconductor device includes the M1 tracks 318A, the PD 314, the device under test 316. The semiconductor device can be in contact with a neighboring device 324, such as another semiconductor device, through one or more wirings 326. In one embodiment, the laser fuse 320 is accessible to laser via a gap 322. The gap 322 can be located in the frontside of the semiconductor device. Alternatively, the gap 322 can be located in the backside of the semiconductor device.

Figure 4:
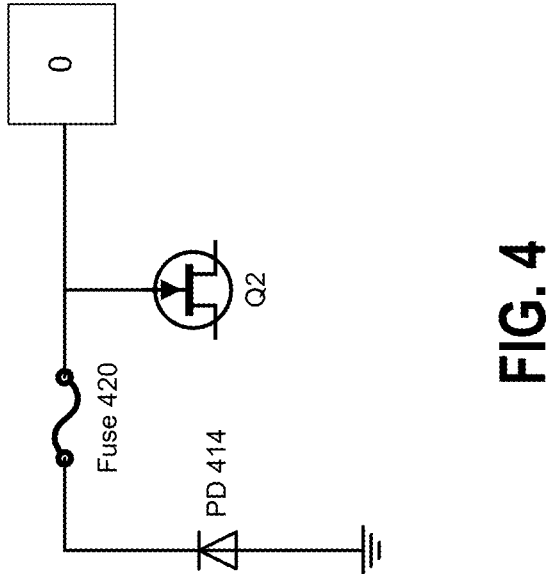
FIG. 4 illustrates a diagram of electrical connections within a semiconductor device, in accordance with some embodiments.

FIG. 4 is a circuit diagram representative of electrical connections within a semiconductor device, in accordance with an illustrative embodiment. In some embodiments, the laser fuse 420 is connected to the PD 414. However, since the laser fuse 420 is a laser fuse, unlike the electrical fuse, there is no need for a fuse pad. The laser fuse 420 can include a narrow metallic fuse link or strap made from material such as polysilicon, silicide polysilicon or metal routing layer, which can be opened up on demand. When a laser pulse with above-the-threshold energy from a laser source strikes the fuse structure, intense heat generation causes explosive vaporization and melting to create an open gap across the link that permanently disrupts current flow.

Figure 5:
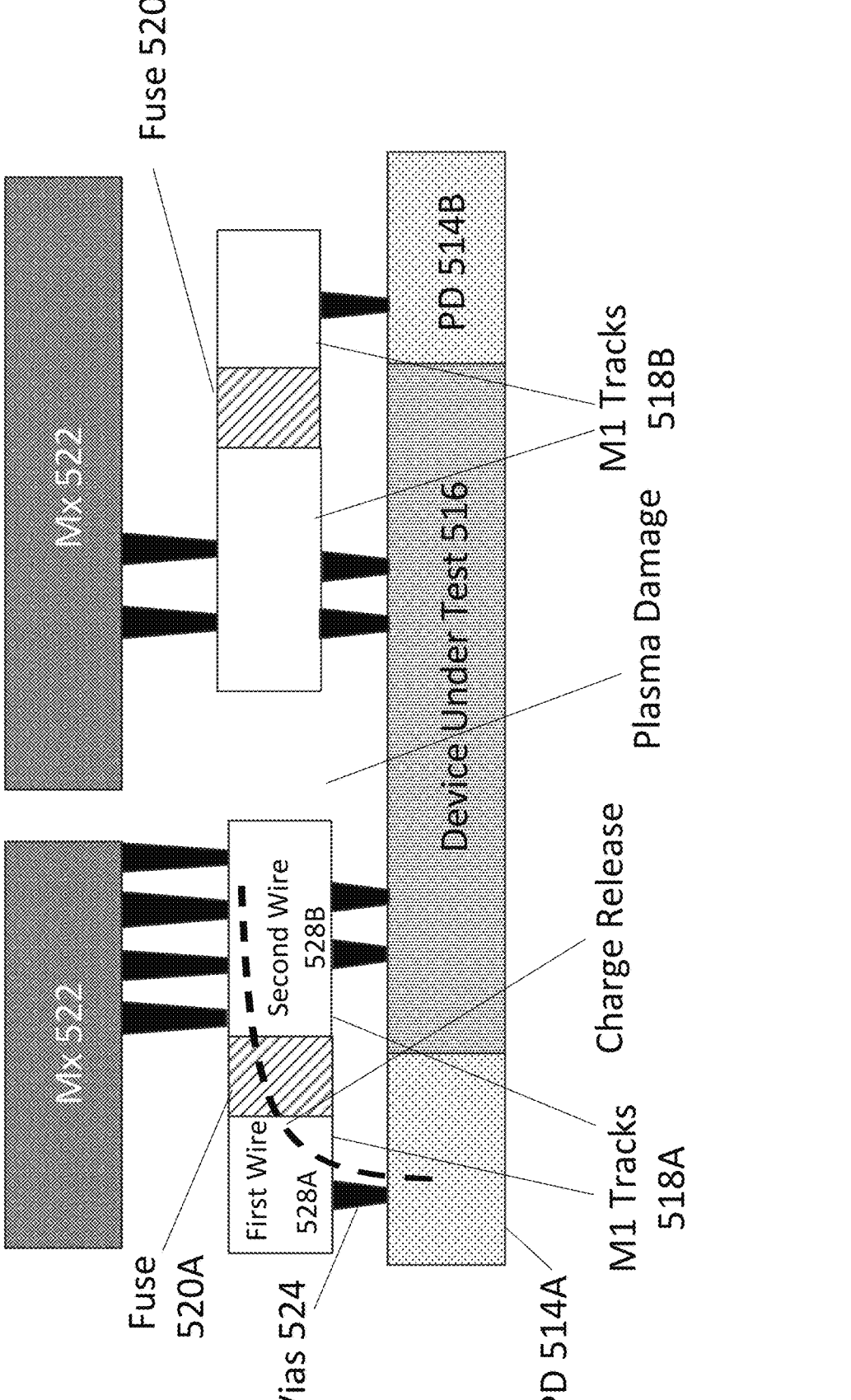
FIG. 5 illustrates a charge release mechanism in a semiconductor device, in accordance with some embodiments.

FIG. 5 illustrates a charge release mechanism in a semiconductor device, in accordance with some embodiments. For example, when the plasma damage occurs during large area vias or large area metal processing, the short electrical fuse 520A provides an electrical path for the charge release from the device under the test 516 to the PD 514A via the M1 tracks 518A. Thus, the fuse 520A and the PD 514A electrically connected to the fuse 520A, provide a discharge path having a lower resistance.

Figure 6A:
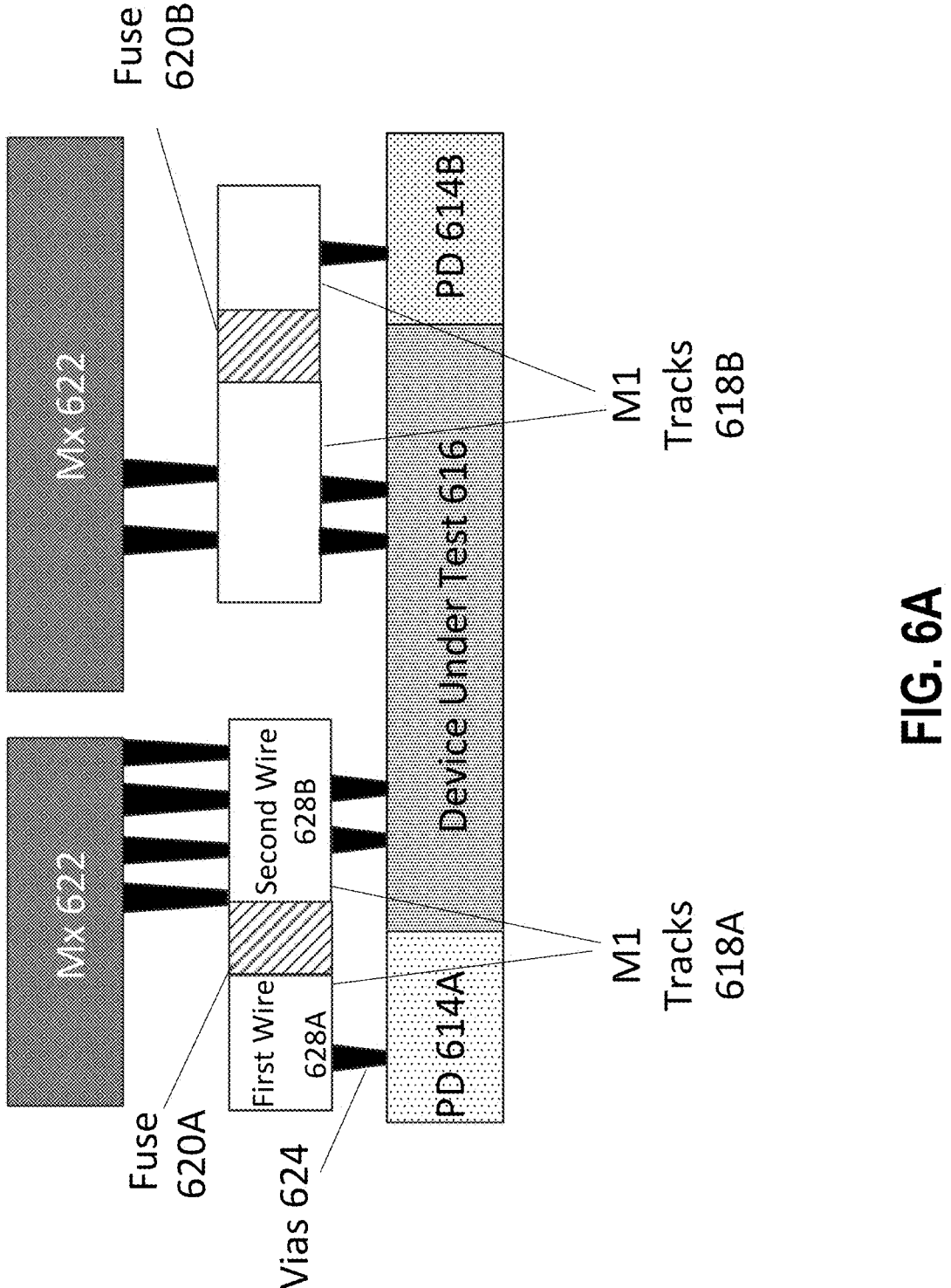
FIG. 6A-6B illustrates a semiconductor device after fabrication and after opening the fuse, in accordance with some embodiments.
Figure 6B:
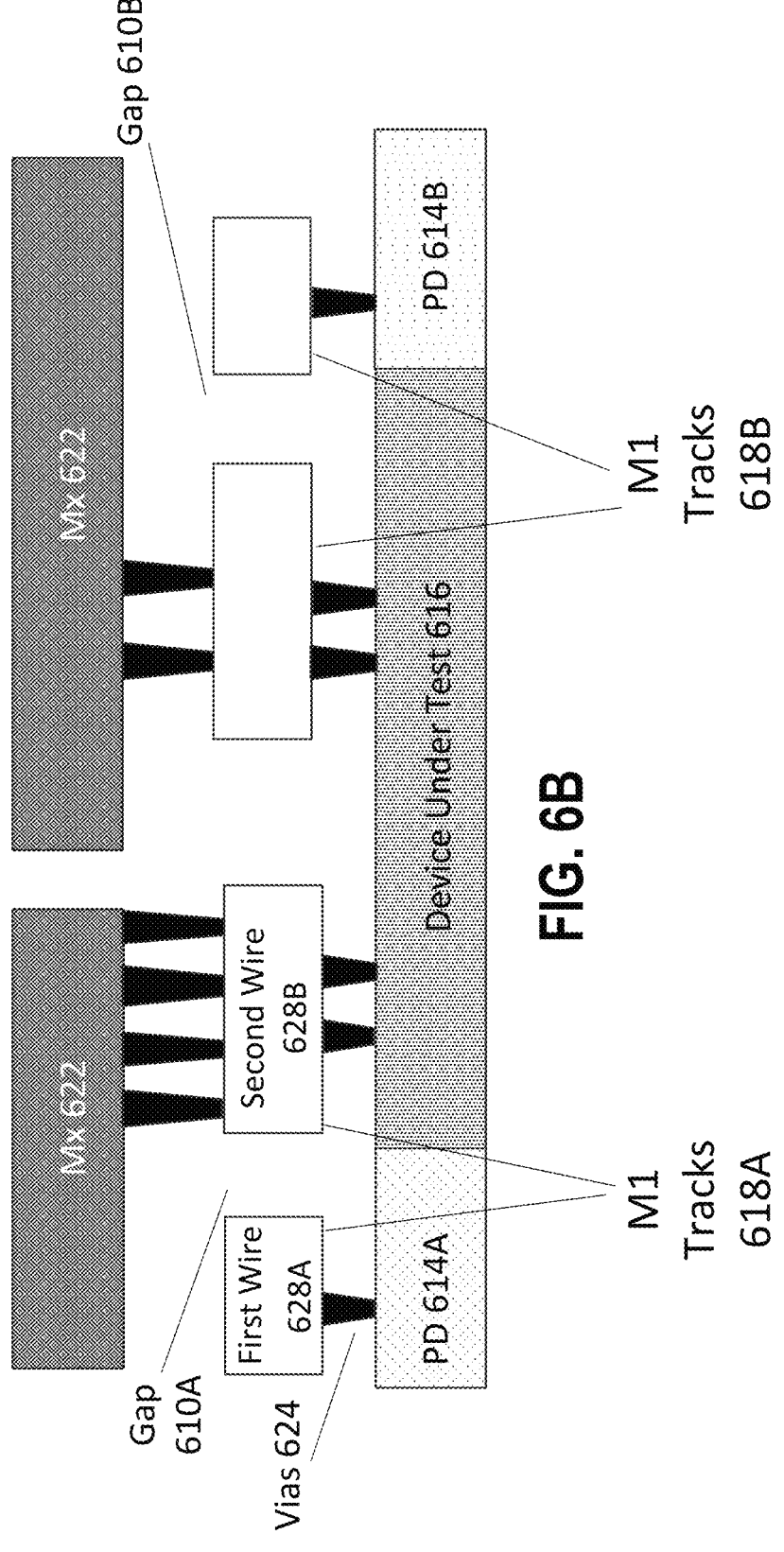

FIGS. 6A-6B illustrate a semiconductor device after fabrication and after opening the fuse, in accordance with some embodiments. The semiconductor device shown in FIG. 6A can be similar to the semiconductor device depicted in FIG. 1. Once the laser fuse 620A is open, e.g., as a result of being exposed to the laser, the gap 610A between the M1 tracks 618A is formed, as shown in FIG. 6B. Unlike an electrical fuse, in order to open the laser fuse 620A, there is no need for a high voltage or a high current. As such, the damage to the device under the test 616 is substantially mitigated.

Figure 7A:
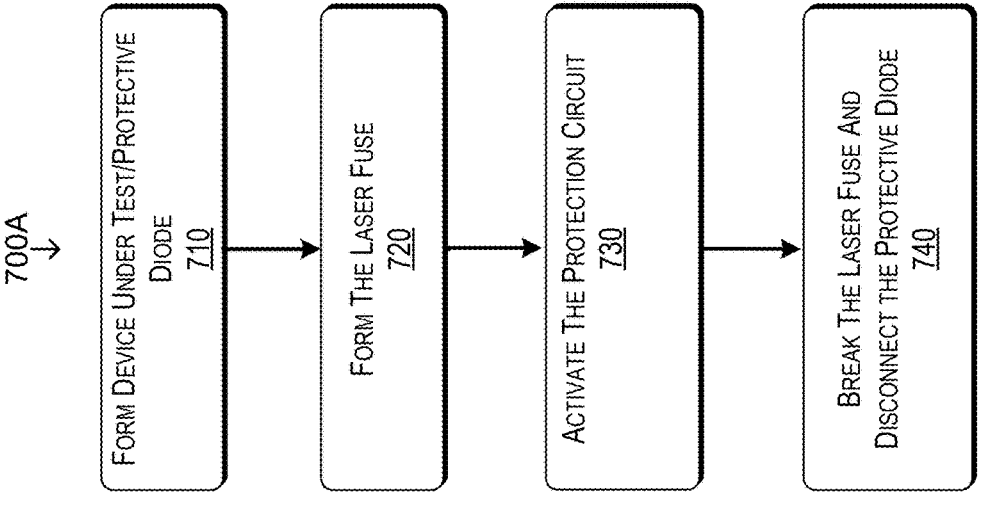
FIGS. 7A-7B illustrate block diagrams of a method for forming the semiconductor device, in accordance with some embodiments.

FIG. 7A illustrates a block diagram of method 700A for protecting a device under test, in accordance with some embodiments. As shown by block 710, the device under test and the protective diode are formed.

As shown by block 720, a laser fuse is formed.

As shown by block 730, a protection circuit is formed.

As shown by block 740, the protection circuit is activated during the back end of line (BEOL) or backside power delivery network (BSPDN) process.

As shown by block 750, the laser fuse is broken before test and the protective diode is disconnected.

Figure 7B:
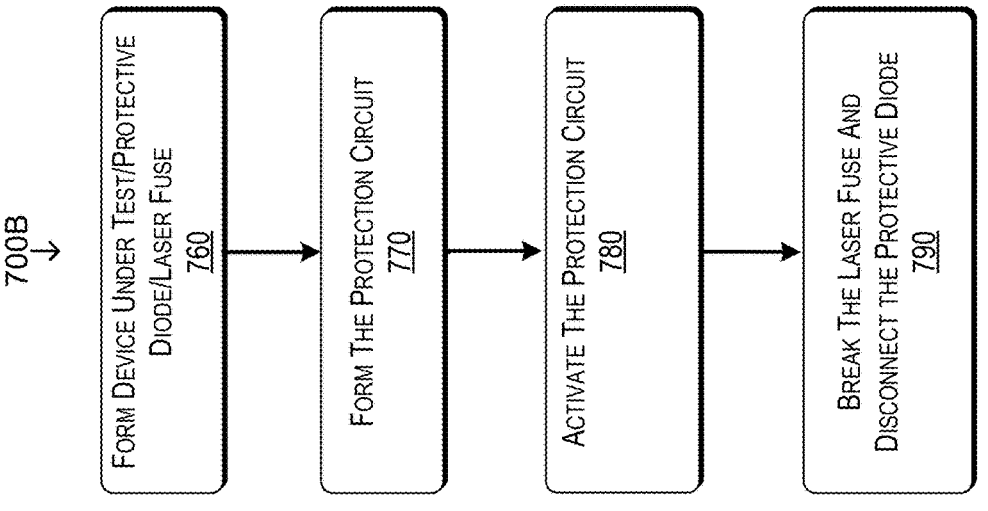

FIG. 7B illustrates a block diagram of method 700B for protecting a device under test, in accordance with some embodiments. As shown by block 760, the device under test, the protective diode, and the laser fuse are formed.

As shown by block 770, a protection circuit is formed.

As shown by block 780, the protection circuit is activated during the back end of line (BEOL) or backside power delivery network (BSPDN) process.

As shown by block 790, the laser fuse is broken before test and the protective diode is disconnected.

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications, and variations that fall within the true scope of the present teachings.

The components, steps, features, objects, benefits, and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. A semiconductor device, comprising:
a device under test; and
a protection circuit electrically connected to the device under test, the protection circuit comprising:
a protective diode; and
a laser fuse configured to, upon receiving a laser pulse via an opening, break an electrical path of the protective diode and the device under test.

2. The semiconductor device of claim 1, further comprising:
a first wire; and
a second wire, wherein the laser fuse is configured to electrically connect the first wire and the second wire.

3. The semiconductor device of claim 2, wherein the first wire is electrically connected to the protective diode.

4. The semiconductor device of claim 2, wherein the second wire is connected to the device under test.

5. The semiconductor device of claim 1, wherein the opening is in a frontside of the semiconductor device.

6. The semiconductor device of claim 1, wherein the opening is in a backside of the semiconductor device.

7. The semiconductor device of claim 1, further comprising:
a first wire; and a second wire, wherein the protection circuit and the device under test are electrically connected.

8. The semiconductor device of claim 7, wherein the laser fuse is configured to electrically connect the first wire and the second wire.

9. The semiconductor device of claim 7, wherein the first wire is electrically connected to the protective diode.

10. The semiconductor device of claim 7, wherein the second wire is electrically connected to the device under test.

11. A method for protecting a device under test, the method comprising:
forming the device under test; and
forming a protection circuit electrically connected to the device under test, wherein forming the protection circuit comprises:
forming a protective diode; and
forming a laser fuse to, upon receiving a laser pulse via an opening, break an electrical path of the protective diode and the device under test.

12. The method of claim 11, further comprising:
forming a first wire;
forming a second wire; and
establishing an electrical connection, by the laser fuse, between the first wire and the second wire, wherein the laser fuse is formed on a frontside of a semiconductor device.

13. The method of claim 12, further comprising:
electrically connecting the second wire to the device under test.

14. The method of claim 12, further comprising:
forming the protection circuit; and
electrically connecting the first wire to the protective diode.

15. The method of claim 11, further comprising:
receiving the laser pulse from the opening in a frontside of a semiconductor device.

16. The method of claim 11, further comprising:
receiving the laser pulse from the opening in a backside of a semiconductor device.

17. The method of claim 11, further comprising:
forming a first wire;
forming a second wire; and
establishing an electrical connection between the protection circuit and the device under test.

18. The method of claim 17, further comprising electrically connecting the laser fuse to the first wire and the second wire.

19. The method of claim 18, further comprising electrically connecting the first wire to the protective diode.

20. An integrated circuit, comprising:
a device; and
a protection circuit electrically connected to the device, the protection circuit comprising:
a protective diode; and
a laser fuse configured to, upon receiving a laser pulse via an opening, break an electrical path of the protective diode and the device.

* * * * *